United States Patent
Okita et al.

(10) Patent No.: US 10,276,423 B2
(45) Date of Patent: Apr. 30, 2019

(54) METHOD OF MANUFACTURING ELEMENT CHIP

(71) Applicant: Panasonic Intellectual Property Management Co., Ltd., Osaka (JP)

(72) Inventors: Shogo Okita, Hyogo (JP); Koji Tamura, Osaka (JP); Akihiro Itou, Kyoto (JP); Atsushi Harikai, Osaka (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/893,999

(22) Filed: Feb. 12, 2018

(65) Prior Publication Data

US 2018/0233395 A1   Aug. 16, 2018

(30) Foreign Application Priority Data

Feb. 16, 2017 (JP) .................................. 2017-027252
Feb. 16, 2017 (JP) .................................. 2017-027253

(51) Int. Cl.
*H01L 21/683* (2006.01)
*H01L 21/78* (2006.01)
(Continued)

(52) U.S. Cl.
CPC ........ *H01L 21/6835* (2013.01); *H01L 21/308* (2013.01); *H01L 21/3065* (2013.01);
(Continued)

(58) Field of Classification Search
None
See application file for complete search history.

(56) References Cited

U.S. PATENT DOCUMENTS

2005/0126694 A1   6/2005  Yamamoto
2010/0173474 A1   7/2010  Arita et al.
(Continued)

FOREIGN PATENT DOCUMENTS

JP    H02-170552 A    7/1990
JP    2005-175384 A   6/2005
(Continued)

OTHER PUBLICATIONS

Japanese Office Action issued in Japanese Patent Application No. JP2017-027252 dated Dec. 18, 2018.
(Continued)

*Primary Examiner* — Jack S Chen
(74) *Attorney, Agent, or Firm* — Pearne & Gordon LLP

(57) ABSTRACT

A method of manufacturing a semiconductor chip includes: preparing a semiconductor wafer; forming a mask on a front surface of the semiconductor wafer so as to cover each of the element regions and to expose the dividing region; exposing the front surface to plasma in a state where a back surface of the semiconductor wafer is held with a dicing tape to dice the semiconductor wafer into a plurality of semiconductor chips by etching the dividing region exposed from the mask up to the back surface while protecting each of the element regions with the mask from plasma; and removing the mask from the front surface together with an adhesive tape by peeling off the adhesive tape after sticking the adhesive tape to the side of the front surface.

7 Claims, 12 Drawing Sheets

(51) Int. Cl.
*H01L 21/308* (2006.01)
*H01L 21/3065* (2006.01)
*H01L 23/00* (2006.01)

(52) U.S. Cl.
CPC .......... *H01L 21/6836* (2013.01); *H01L 21/78* (2013.01); *H01L 24/12* (2013.01); *H01L 2221/6834* (2013.01); *H01L 2221/68318* (2013.01); *H01L 2221/68327* (2013.01); *H01L 2221/68336* (2013.01); *H01L 2221/68386* (2013.01)

(56) References Cited

U.S. PATENT DOCUMENTS

2018/0233395 A1* 8/2018 Okita .................. H01L 21/6835
2018/0342424 A1* 11/2018 Okita ..................... H01L 21/78

FOREIGN PATENT DOCUMENTS

| | | |
|---|---|---|
| JP | 2005-191039 A | 7/2005 |
| JP | 2008-193034 A | 8/2008 |
| JP | 2012-248741 A | 12/2012 |
| WO | 2008/096542 A1 | 8/2008 |

OTHER PUBLICATIONS

Japanese Office Action issued in Japanese Patent Application No. JP2017-027253 dated Dec. 18, 2018.

* cited by examiner

METHOD OF MANUFACTURING ELEMENT CHIP

CROSS-REFERENCE TO RELATED APPLICATIONS

This application claims priority of Japanese Patent Application No. 2017-027252 filed on Feb. 16, 2017 and 2017-027253 filed on Feb. 16, 2017 the contents of which are incorporated herein by reference.

BACKGROUND OF THE INVENTION

Field of the Invention

The present invention relates to a method of manufacturing an element chip.

Description of Related Art

Plasma etching may be used to manufacture element chips. Plasma etching is widely used, and for example, a method called plasma dicing for dicing a substrate is known as one of plasma etching methods. In plasma dicing, on a substrate including a plurality of element regions defined by dividing regions, the dividing regions are plasma etched from one side up to the other side of the substrate, and the substrate is diced into each element chip. In such plasma dicing, there is a need that only the dividing regions are plasma etched and the element regions are protected from plasma etching. Therefore, in general, a mask having plasma resistance property is formed on the front surface of the element regions before plasma etching. In this case, the mask formed on the front surface of the substrate is removed by ashing or the like after plasma dicing. A method of manufacturing element chips with a series of flows from such plasma dicing to ashing is disclosed in, for example, JP 2012-248741 A.

Since the ashing after plasma dicing is performed with the element chip stuck to a relatively poor heat-resistant holding member such as a dicing tape, the temperature during ashing needs to be maintained at a temperature at which the holding member does not deteriorate, and the temperature of mask tends to decrease. When the temperature of the mask decreases and ashing reactivity cannot be sufficiently secured, ashing residues may be generated even if ashing is performed on the mask. That is, in the ashing disclosed in JP 2012-248741 A, the mask may not be sufficiently removed. In addition, ashing may not be used for an element chip vulnerable to damage by ultraviolet (UV) light such as a complementary metal oxide semiconductor (CMOS) image sensor, for example. Therefore, the ashing is not perfect in removing the mask in the manufacturing process of element chips such as plasma etching, and there is room for improvement.

SUMMARY OF THE INVENTION

It is an object of the present invention to prevent ashing defects in a method of manufacturing an element chip and to improve the productivity of an element chip.

A first method of manufacturing an element chip of the present invention includes: preparing a substrate having a first surface with a step, a second surface opposite to the first surface, a plurality of element regions in each of which the step is formed, and a dividing region that defines each of the element regions; forming a mask on the first surface of the substrate so as to cover each of the element regions and to expose the dividing region; exposing the first surface of the substrate to plasma in a state where the second surface of the substrate is held by a holding member to dice the substrate into a plurality of rectangular element chips by etching the dividing region exposed from the mask up to the second surface while protecting each of the element regions by the mask from plasma; and removing the mask remaining on the surface of the substrate from the surface of the diced substrate together with an adhesive tape by peeling off the adhesive tape while being pulled in a direction deviated from a short side direction and a long side direction of the element chip after sticking the adhesive tape to the side of the first surface of the diced substrate.

According to this method, when a mask is removed from the element chip having a step on the front surface, an adhesive tape is used without ashing. Since the mask can be physically removed by using an adhesive tape, it is easier for this method to remove the mask than for ashing. Furthermore, even if a residue is present on the mask surface, the residue is physically removed together with the mask. In addition, in this method, the peeling direction of the adhesive tape is defined in a direction deviated from the short side direction and the long side direction of the element chip. Since the peeling direction is thus defined, the mask can be peeled from the corner portion of the element chip together with the adhesive tape. That is, since the mask can be peeled from a point rather than being peeled from a side, the load applied to the element chip at the initial stage of peeling can be reduced. Therefore, it is easy to peel off the mask cleanly, the element chip hardly breaks, and the element chip is hardly peeled off from the holding member so that productivity can be improved. The term "rectangle" used here includes not only a perfect rectangle but also a substantially rectangular shape such as a rectangle having rounded corners.

The adhesive tape may be peeled off while being pulled in a diagonal direction of the element chip.

According to this method, the peeling direction of the adhesive tape is defined in a diagonal direction of the element chip. The diagonal direction of the element chip is a line that can secure the longest flow line for peeling off the mask. Therefore, the load generated at the time of peeling off the mask can be dispersed and the local load on the element chip can be reduced. Therefore, the element chip hardly breaks and the element chip is hardly peeled off from the holding member.

The mask may be formed by sticking a sheet-like mask and a gap may be provided between the periphery of the step and the sheet-like mask.

According to this method, since the contact area between the mask and the substrate can be reduced by the gap being provided, the mask is easily peeled off from the substrate.

The mask may be removed in a state where the holding member is placed on a stage with being vacuum-attracted to the stage. Alternatively, the mask may be removed in a state where the holding member is placed on a stage with being electrostatically attracted to the stage.

According to these methods, since the holding member can be prevented from separating from the stage when the mask is peeled off, the mask can be stably peeled off from the substrate.

An adhesive force between the adhesive tape and the mask may be enhanced by heating the adhesive tape after sticking the adhesive tape and before peeling off the adhesive tape. Alternatively, an adhesive force between the adhesive tape and the mask may be enhanced by irradiating the adhesive tape with UV light after sticking the adhesive tape and before peeling off the adhesive tape.

According to these methods, since the adhesive force between the adhesive tape and the mask can be enhanced, the mask can be prevented from remaining when the adhesive tape is peeled off, that is, the mask can be easily peeled off from the substrate together with the adhesive tape.

A second method of manufacturing an element chip of the present invention includes: preparing a substrate having a first surface with a step, a second surface opposite to the first surface, a plurality of element regions in each of which the step is formed, and a dividing region that defines each of the element regions; forming a mask on the first surface of the substrate so as to cover each of the element regions and to expose the dividing region; exposing the first surface of the substrate to plasma in a state where the second surface of the substrate is held by a holding member to dice the substrate into a plurality of element chips by etching the dividing region exposed from the mask up to the second surface with protecting each of the element regions by the mask from plasma; and removing the mask remaining on the surface of the substrate from the surface of the diced substrate together with an adhesive tape by peeling off the adhesive tape after sticking the adhesive tape to the side of the first surface of the diced substrate so as to be in contact with an outer edge of the element chip.

According to this method, when a mask is removed from the element chip having a step on the front surface, an adhesive tape is used without ashing. Since the mask can be physically removed by using the adhesive tape, it is easier for this method to remove the mask than for ashing. Furthermore, even if a residue is present on the mask surface, the residue is physically removed together with the mask. In addition, in this method, since the adhesive tape is stuck so as to be in contact with the outer edge of the element chip, when the adhesive tape is peeled off, the mask can be peeled off from the end of the element chip, that is, the mask can be easily peeled off cleanly. Therefore, in the method of manufacturing the element chip, ashing defects can be prevented and the productivity of the element chip can be improved.

Gaps between the plurality of element chips held by the holding member may be widened by expanding the holding member, after the dicing of the substrate and before the sticking of the adhesive tape.

According to this method, since the gap between the element chips is widened before the adhesive tape is stuck, the adhesive tape can be easily stuck to the outer edge of each element chip.

The adhesive tape may include a base layer and an adhesive layer.

According to this method, the handleability of the adhesive tape can be improved with the base layer, and the adhesive tape can be brought into close contact with the mask with the adhesive layer.

The adhesive layer of the adhesive tape may be made of a thermosetting resin, and an adhesive force between the adhesive tape and the mask may be enhanced by heating the adhesive tape to cure the adhesive layer after the sticking of the adhesive tape and before the peeling off of the adhesive tape. Alternatively, the adhesive layer of the adhesive tape may be made of a UV curable resin, and an adhesive force between the adhesive tape and the mask may be enhanced by irradiating the adhesive tape with UV light to cure the adhesive layer after the sticking of the adhesive tape and before the peeling off of the adhesive tape.

According to these methods, since the adhesive force between the adhesive tape and the mask can be enhanced by the heat treatment or the UV treatment, the mask can be prevented from remaining when the adhesive tape is peeled off, that is, the mask can be easily peeled off from the substrate together with the adhesive tape.

The thickness of the adhesive layer may be larger than the height or the depth of the step.

According to this method, since the step can be covered with the adhesive layer, the contact area between the mask and the adhesive tape is increased, and the mask is easily peeled off cleanly.

The adhesive tape may further include a buffer layer, which is more deformable in the thickness direction than the base layer, disposed between the base layer and the adhesive layer.

According to this method, since the elasticity of the adhesive tape can be improved with the buffer layer, the adhesive tape can be deformed into a shape matching the step to be stuck. That is, since the contact area between the mask and the adhesive tape can be increased, the mask can be easily peeled off from the substrate together with the adhesive tape. In addition, the buffer layer can alleviate the impact when the adhesive tape is stuck.

The buffer layer of the adhesive tape may be made of a thermoplastic resin, and the degree of adhesion between the adhesive tape and the mask may be enhanced by heating the adhesive tape to soften the buffer layer after the sticking of the adhesive tape and before the peeling off of the adhesive tape.

According to these methods, the degree of adhesion between the adhesive tape and the mask can be increased by heat treatment. That is, since the contact area between the mask and the adhesive tape can be further increased, the mask can be easily peeled off from the substrate together with the adhesive tape.

The thickness of the buffer layer may be larger than the height or the depth of the step.

According to this method, since the step can be covered with the buffer layer and the adhesive layer, the contact area between the mask and the adhesive tape is increased, and the mask is easily peeled off cleanly.

The adhesive tape may be stuck by pressing the adhesive tape toward the substrate with a compressed fluid while bringing the adhesive tape into contact with the first surface of the substrate.

According to this method, the adhesive tape can be stuck along the unevenness on the front surface without excessive force being applied to the front surface of the element chip having unevenness on the front surface.

The mask may be formed by sticking a sheet-like mask and a gap may be provided between the periphery of the step and the sheet-like mask.

According to this method, since the contact area between the mask and the substrate can be reduced by the gap being provided, the mask is easily peeled off from the substrate.

The mask may be removed in a state where the holding member is placed on a stage with being vacuum-attracted to the stage. Alternatively, the mask may be removed in a state where the holding member is placed on a stage with being electrostatically attracted to the stage.

According to these methods, since the holding member can be prevented from separating from the stage when the mask is peeled off, the mask can be stably peeled off from the substrate.

Effects of the Invention

According to the present invention, since the mask is physically removed with the adhesive tape without ashing in the method of manufacturing an element chip, ashing defects can be prevented and the productivity of the element chip can be improved.

DETAILED DESCRIPTION OF THE PREFERRED EMBODIMENT

In the following, embodiments of the present invention will be described with reference to the accompanying drawings.

First Embodiment

Figure 1A:
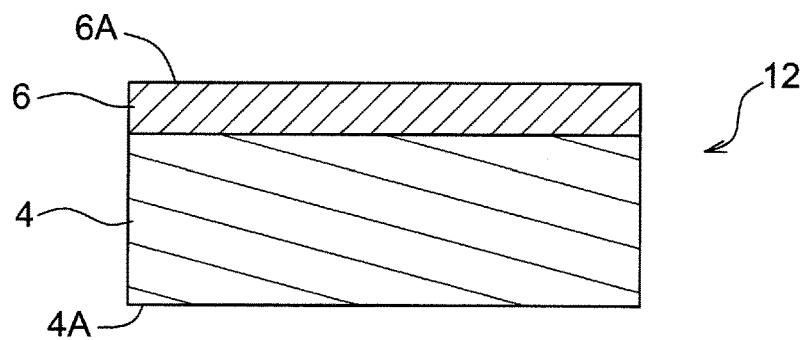
FIG. 1A is a cross-sectional view showing a first preparation step of a method of manufacturing an element chip according to a first embodiment of the present invention.
Figure 1B:
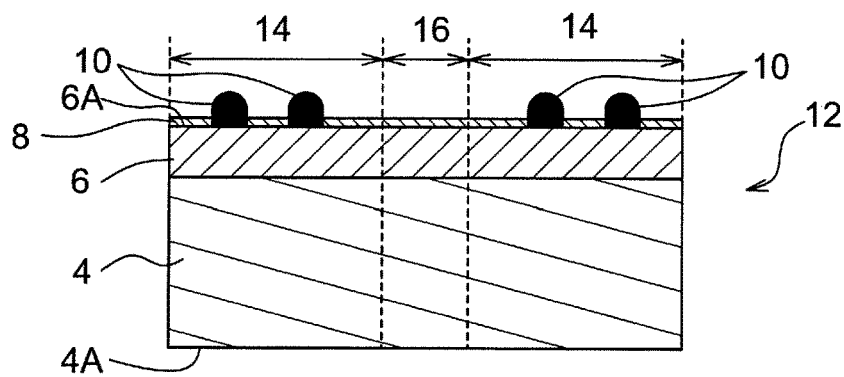
FIG. 1B is a cross-sectional view showing a second preparation step of the method of manufacturing the element chip according to a first embodiment of the present invention.
Figure 1C:
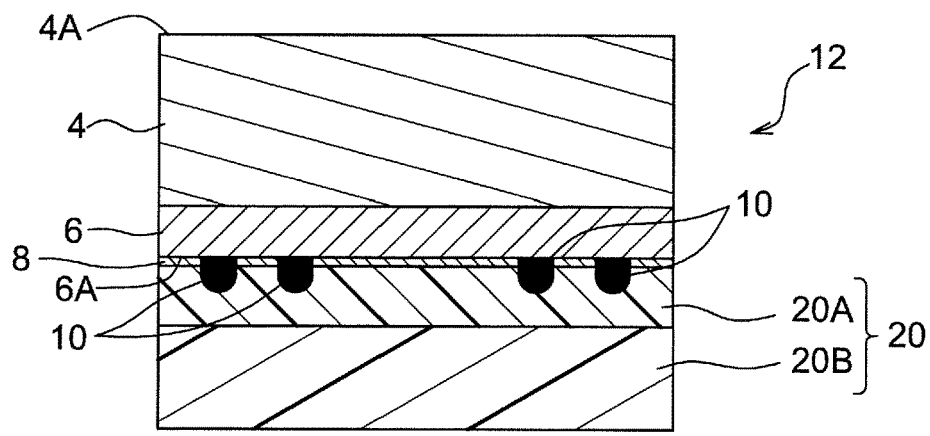
FIG. 1C is a cross-sectional view showing a protection step of the method of manufacturing the element chip according to a first embodiment of the present invention.
Figure 1D:
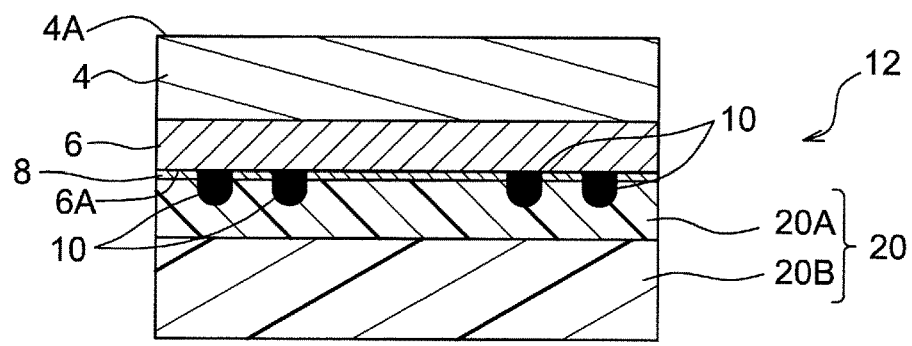
FIG. 1D is a cross-sectional view showing a thinning step of the method of manufacturing the element chip according to a first embodiment of the present invention.
Figure 1E:
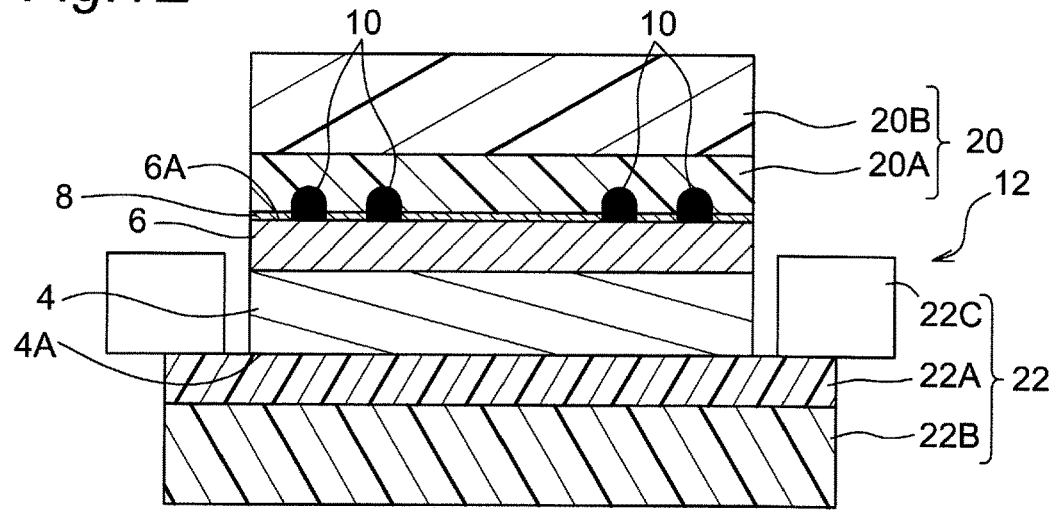
FIG. 1E is a cross-sectional view showing a first holding step of the method of manufacturing the element chip according to a first embodiment of the present invention.
Figure 1F:
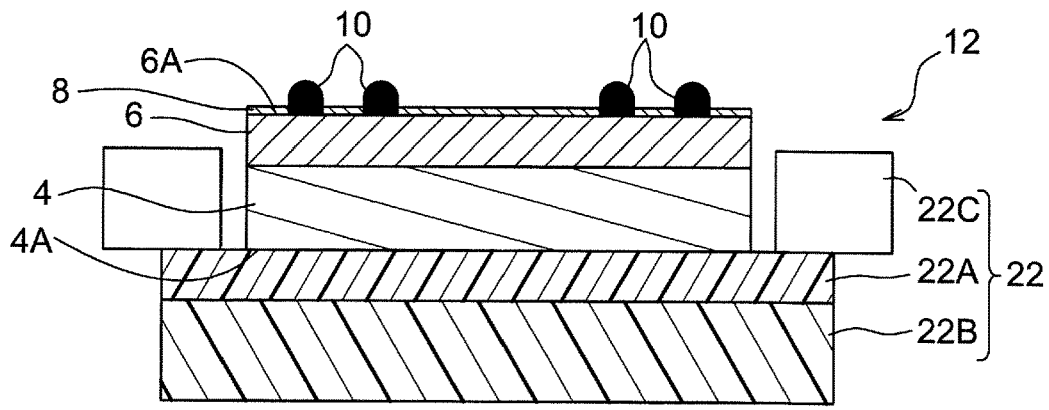
FIG. 1F is a cross-sectional view showing a second holding step of the method of manufacturing the element chip according to a first embodiment of the present invention.
Figure 1G:
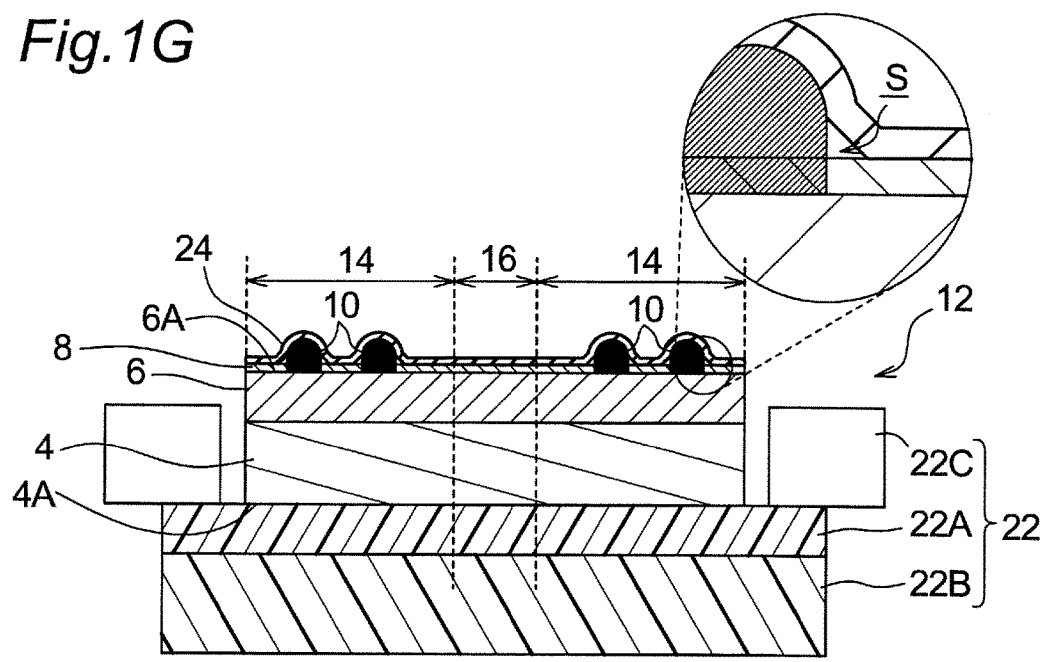
FIG. 1G is a cross-sectional view showing a first mask forming step of the method of manufacturing the element chip according to a first embodiment of the present invention.
Figure 1H:
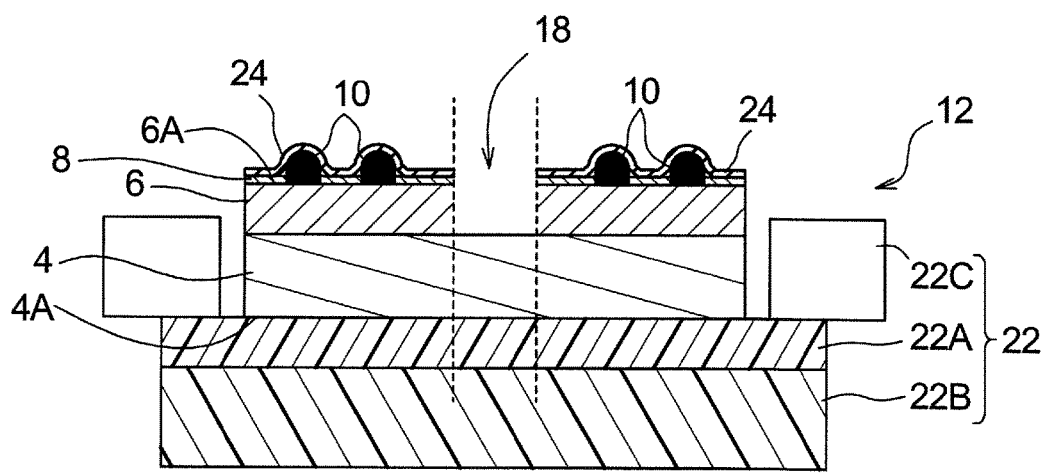
FIG. 1H is a cross-sectional view showing a second mask forming step of the method of manufacturing the element chip according to a first embodiment of the present invention.
Figure 1I:
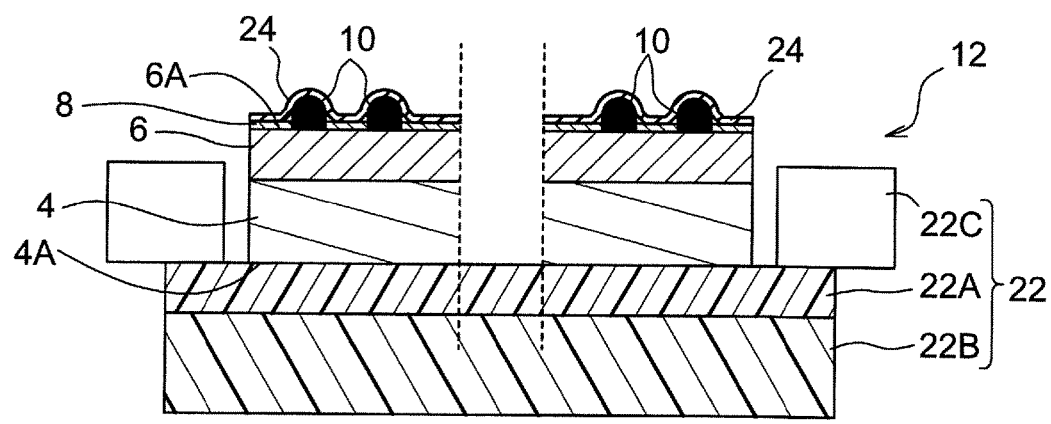
FIG. 1I is a cross-sectional view showing a dicing step of the method of manufacturing the element chip according to a first embodiment of the present invention.
Figure 1J:
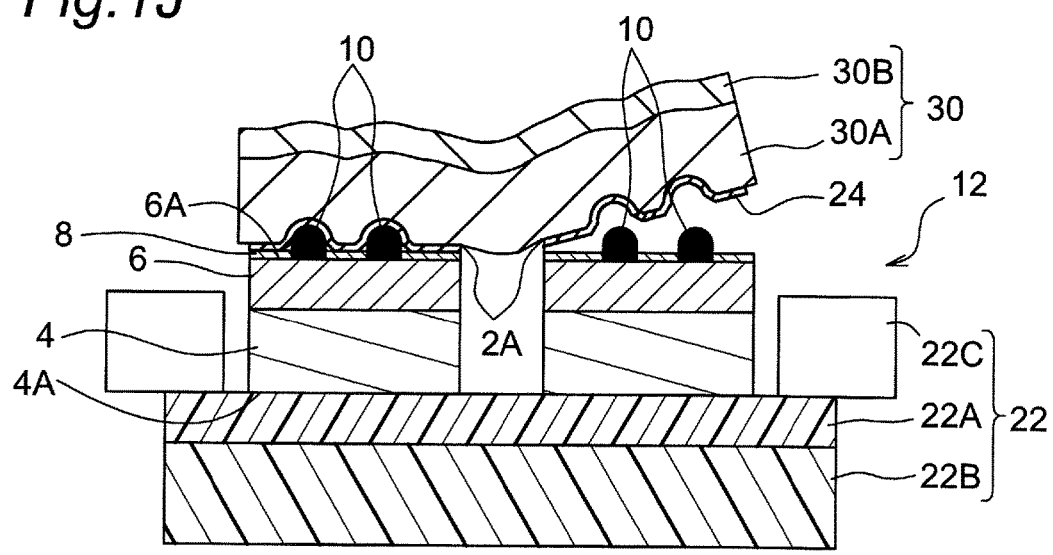
FIG. 1J is a cross-sectional view showing a mask removing step of the method of manufacturing the element chip according to a first embodiment of the present invention.
Figure 1K:
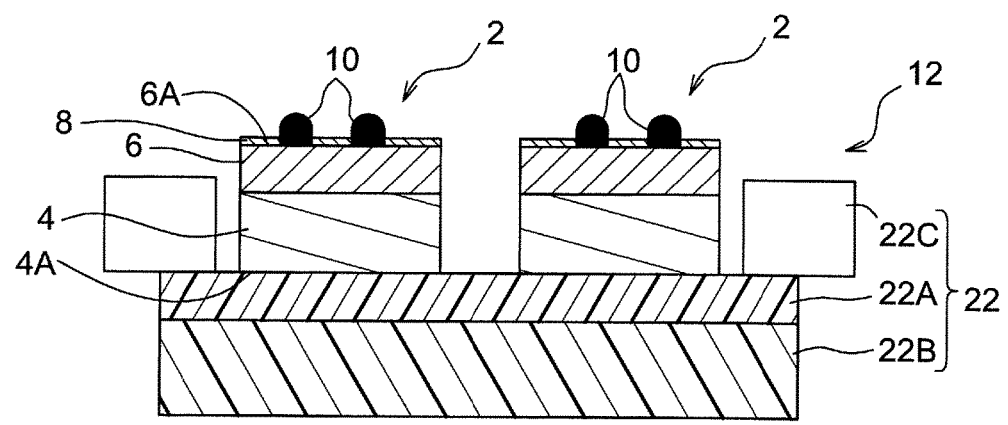
FIG. 1K is a cross-sectional view showing an element chip manufactured by the method of manufacturing the element chip according to a first embodiment of the present invention.

FIGS. 1A to 1K show manufacturing steps of a semiconductor chip (element chip) 2 according to the first embodiment of the present invention. Referring to FIG. 1K being a completed view, the manufactured semiconductor chip 2 includes a semiconductor layer 4, a wiring layer 6 formed on the semiconductor layer 4, a protective film 8 formed on the wiring layer 6, and bumps 10 as electrodes. The semiconductor layer 4 is made of, for example, Si or a Si-based material, and the wiring layer 6 is made of, for example, an insulating film such as $SiO_2$ and metal such as Cu. The material of the insulating film of the wiring layer 6 may be SiN, SiOC, Low-k material, or the like. In addition, the material of the metal of the wiring layer 6 may be Al, Al alloy, W, or the like. In addition, the metal contained in the bumps 10 may be copper; an alloy of copper, tin, and silver; an alloy of silver and tin; an alloy of lead and tin; gold; aluminum; an aluminum alloy; or the like. The shape of the bumps 10 is not particularly limited, and may be a prism, a cylinder, a mountain, a ball, or the like. The arrangement and the number of the bumps 10 are not particularly limited, and are appropriately set according to the purpose. Here, the bumps 10 as an electrode are an example of the step of the present invention. The step of the present invention may be a recessed pad electrode besides the protruding bumps 10 of the present embodiment.

In a first preparation step shown in FIG. 1A, a semiconductor wafer (substrate) 12 is prepared. As shown in FIG. 1A, the semiconductor wafer 12 includes a semiconductor layer 4 and a wiring layer 6 formed on the semiconductor layer 4.

In a second preparation step shown in FIG. 1B, a protective film 8 and bumps 10 are formed on a front surface (first surface) 6A of the wiring layer 6 of the semiconductor wafer 12. The semiconductor wafer 12 through this step includes a plurality of element regions 14 in which the bumps 10 are formed and a dividing region 16 adjacent to the periphery of the individual element regions 14. In other words, the individual element regions 14 are defined with the dividing region 16.

In the protection step shown in FIG. 1C, a BG (back grind) tape 20 for protecting the back surface 4A during grinding is stuck to the front surface 6A of the semiconductor wafer 12. The BG tape 20 is a protective film including an adhesive layer 20A and a resin base layer 20B. That is, the adhesive layer 20A is stuck to the front surface 6A of the semiconductor wafer 12, and the surface 6A of the semiconductor wafer 12 is protected with the base layer 20B. Since the BG tape 20 is cut in accordance with the outer shape of the semiconductor wafer 12 after being stuck or before being stuck to the semiconductor wafer 12, the handleability of the semiconductor wafer 12 is not impaired.

In the thinning step shown in FIG. 1D, the semiconductor layer 4 is ground from the back surface (second surface) 4A side of the semiconductor wafer 12 by a grinding device (not shown). The semiconductor wafer 12 is thinned to a predetermined thickness by the semiconductor layer 4 being ground.

In the first holding step shown in FIG. 1E, the dicing tape (holding member) 22 is stuck to the back surface 4A of the semiconductor wafer 12. The dicing tape 22 is a holding film made of an adhesive layer 22A and a resin base layer 22B. The adhesive layer 22A is stuck to the back surface 4A of the semiconductor wafer 12, and the semiconductor wafer 12 is held with the base layer 22B. In addition, a frame 22C is attached to the dicing tape 22 from the viewpoint of handleability.

In the second holding step shown in FIG. 1F, the BG tape 20 is peeled off from the semiconductor wafer 12 to be removed. In a state where the BG tape 20 is removed, the bumps 10 are exposed at the front surface 6A of the semiconductor wafer 12.

In the first mask forming step shown in FIG. 1G, a sheet-like mask 24 is stuck to the front surface 6A of the semiconductor wafer 12. The sheet-like mask 24 has plasma resistance. Therefore, the portion to which the mask 24 is stuck of the semiconductor wafer 12 is protected from the subsequent plasma etching. As shown partially enlarged in FIG. 1G, in a state where the mask 24 is stuck, a gap S is provided between the periphery of the bumps 10 and the mask 24. Since the mask 24 can be easily peeled off later by this gap S being provided, it is preferable to use a method of sticking a sheet-like mask 24 as in the present embodiment, as a method of forming the mask 24. However, the method of forming the mask 24 is not limited to the method of sticking the sheet-like mask 24 in this manner, and any method such as a spin coating method or a spray coating method may be used.

In the second mask forming step shown in FIG. 1H, the mask 24 and the semiconductor wafer 12 are cut by laser scribing, mechanical dicing, or the like in a portion corresponding to the dividing region 16 (see FIG. 1G), so that an exposed portion 18 is formed. Specifically, the exposed portion 18 is formed by the wiring layer 6, the protective film 8, and the mask 24 being cut, and the semiconductor layer 4 may be partly cut or may not be cut at this time, the semiconductor layer 4 is not completely cut. Therefore, when the semiconductor wafer 12 is viewed from the front surface 6A side, the semiconductor layer 4 is exposed in the exposed portion 18. Alternatively, the second mask forming step may include performing exposure and development treatment on the mask 24 to form an opening in a portion corresponding to the dividing region 16 of the mask 24, and then etching the protective film 8 and the wiring layer 6 to form the exposed portion 18.

Figure 2:
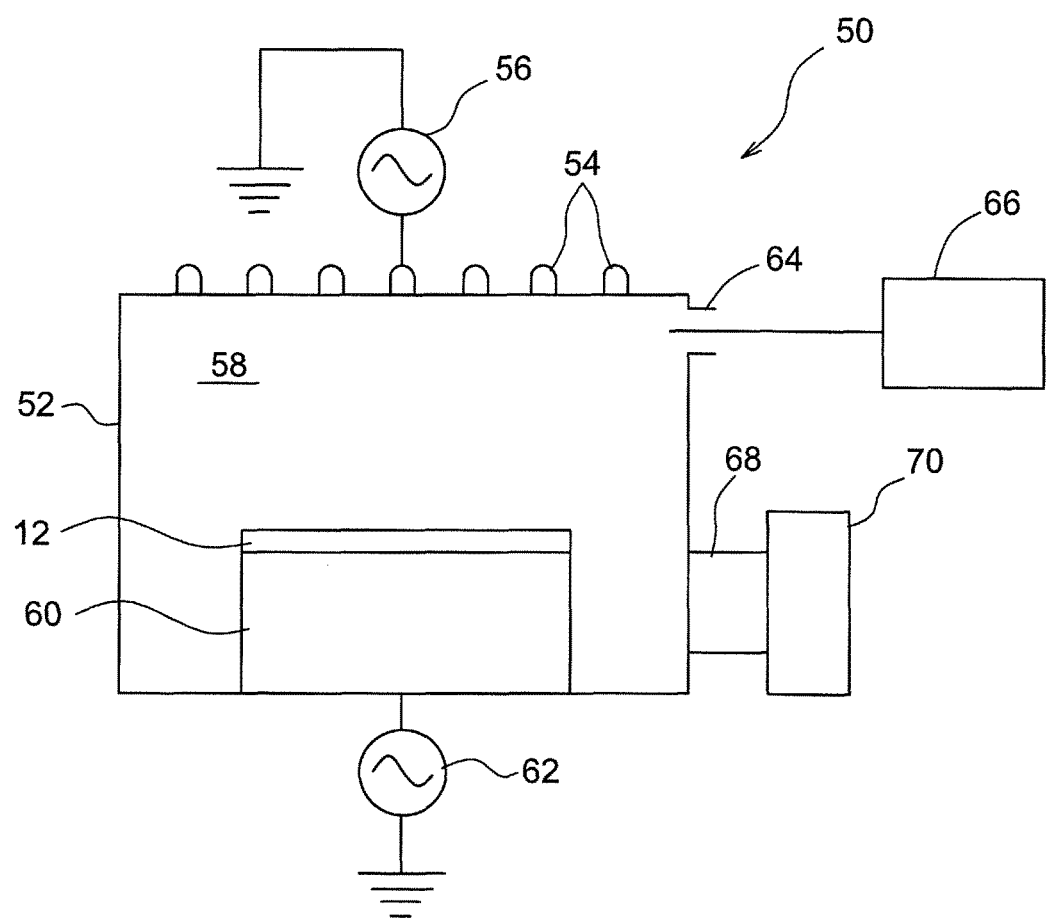
FIG. 2 is a schematic view of a plasma etching apparatus.

In the dicing step shown in FIG. 1I, the semiconductor wafer 12 is diced by plasma etching (plasma dicing) in a state where the back surface 4A of the semiconductor wafer 12 is held with the dicing tape 22. Furthermore, FIG. 2 shows an example of a dry etching apparatus (plasma etching apparatus) 50 used in this step. A dielectric window is provided at the top of the chamber 52 of the dry etching apparatus 50, and antennas 54 as upper electrodes are disposed above the dielectric window. The antenna 54 is electrically connected to a first high frequency power supply unit 56. On the other hand, a stage 60 on which the semiconductor wafer 12 is disposed is disposed on the bottom side of the treatment chamber 58 in the chamber 52. The stage 60 also functions as a lower electrode and is electrically connected to the second high frequency power supply unit 62. In addition, the stage 60 includes an electrostatic attracting electrode (ESC electrode) (not shown), and the dicing tape 22 placed on the stage 60 (that is, semiconductor wafer 12) can be electrostatically attracted to the stage 60. Alternatively, a vacuum attracting mechanism may be adopted, and the dicing tape 22 placed on the stage 60 (that is, semiconductor wafer 12) maybe vacuum attracted to the stage 60. In addition, the stage 60 includes a cooling gas hole for supplying a cooling gas (not shown), and supplying a cooling gas such as helium from the cooling gas hole allows the semiconductor wafer 12 electrostatically attracted to the stage 60 to be cooled. A gas inlet 64 of the chamber 52 is fluidically connected to an etching gas source 66 and an exhaust port 68 is connected to a vacuum exhaust unit 70 including a vacuum pump for evacuating the inside of the chamber 52.

In this dicing step, the semiconductor wafer 12 is placed on the stage 60 via the dicing tape 22, the inside of the treatment chamber 58 is evacuated by the vacuum exhaust unit 70, and an etching gas such as $SF_6$ is supplied from the etching gas source 66 into the treatment chamber 58. Then, the inside of the treatment chamber 58 is maintained at a predetermined pressure, high-frequency power is supplied from the first high frequency power supply unit 56 to the antenna 54, plasma is generated in the treatment chamber 58, and the semiconductor wafer 12 is irradiated with the plasma. At this time, the semiconductor layer 4 of the semiconductor wafer 12 exposed at the exposed portion 18 is removed by the physicochemical action of radicals and ions in the plasma. Through this dicing step, the semiconductor wafer 12 is formed on individual rectangular semiconductor chips 2 (see FIGS. 4A and 4B). The term "rectangle" used here includes not only a perfect rectangle but also a substantially rectangular shape such as a rectangle having rounded corners.

In the mask removal step shown in FIG. 1J, the adhesive tape 30 is stuck to the front surface 6A of the semiconductor chip 2, and the adhesive tape 30 is peeled off together with the mask 24, which removes the mask 24. The adhesive tape 30 used for peeling off the mask 24 has a two-layer structure. That is, the adhesive tape 30 includes an adhesive layer 30A and a resin base layer 30B. The adhesive layer 30A of the present embodiment is made of a UV curable resin. In this step, the irradiation of UV light after sticking the adhesive tape 30 and before peeling off the adhesive tape 30 cures the adhesive layer 30A to enhance the adhesive force between the adhesive layer 30A and the mask 24. Alternatively, the adhesive layer 30A may be made of a thermosetting resin. Also in this case, the heat treatment after sticking the adhesive tape 30 and before peeling off the adhesive tape 30 makes it possible to cure the adhesive layer 30A to enhance the adhesive force between the adhesive layer 30A and the mask 24.

Thus, the semiconductor chip 2 is manufactured as shown in FIG. 1K through the steps of FIGS. 1A to 1J.

Here, the mask removing step will be described in detail with reference to FIGS. 3 to 6. It should be noted that these figures are schematically shown for clarity of description. Therefore, there may be portions not corresponding to FIG. 1J showing the above-described mask removing step.

Figure 3:
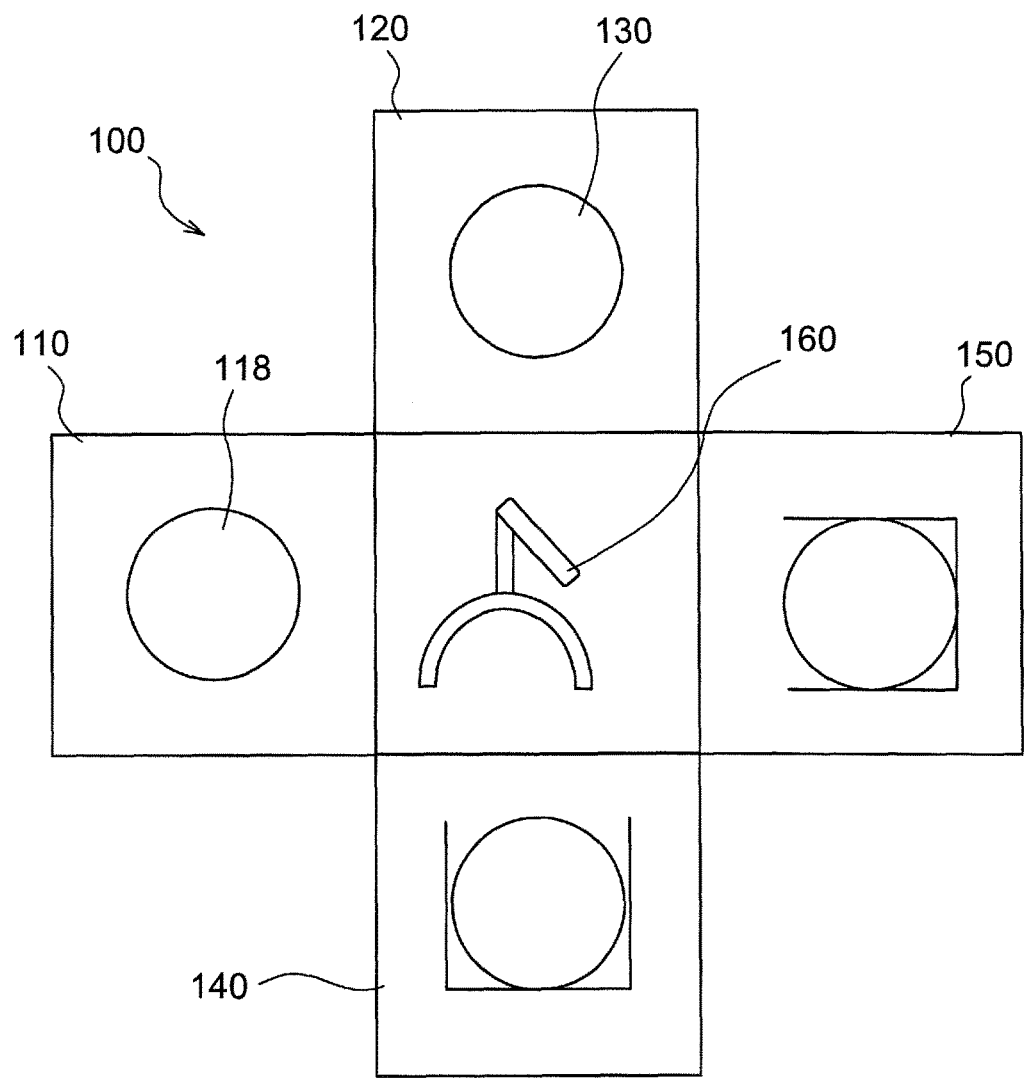
FIG. 3 is a schematic configuration view of the mask removing apparatus.

As shown in FIG. 3, a mask removing apparatus 100 used in the mask removing step of the present embodiment includes an expanding section 110, an adhesive tape attaching/detaching section 120, a first cassette placing section 140, a second cassette placing section 150, and a conveying mechanism 160 for conveying the semiconductor wafer 12 therebetween.

On the first cassette placing section 140, the semiconductor wafer 12 before the treatment of the mask removing step is placed. The semiconductor wafer 12 is conveyed from the first cassette placing section 140 to the expanding section 110 by the conveying mechanism 160.

Figure 4A:
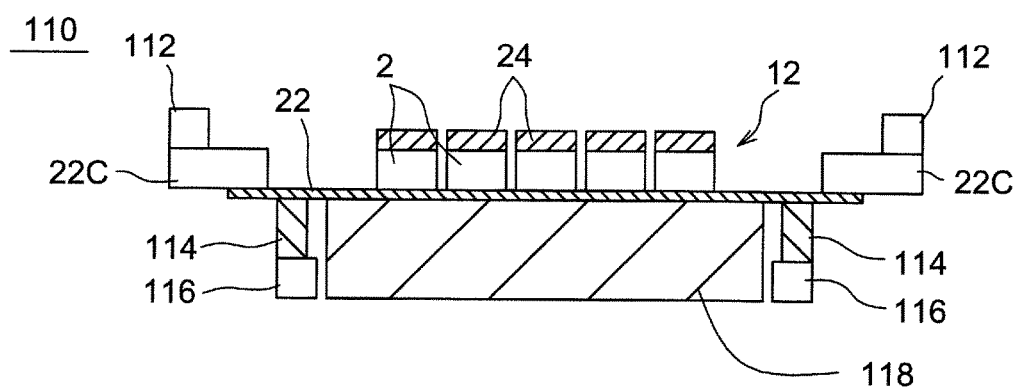
FIG. 4A is a first cross-sectional view showing the expanding process in a mask removing step.

The expanding section 110 is a portion for expanding the space between the semiconductor chips 2. As shown in FIG. 4A, in the semiconductor wafer 12 after the dicing step (see FIG. 1I), the space between the semiconductor chips 2 is narrow, and for example, the space is about 20 µm. If this space is narrow, as shown in FIG. 1J, there is a possibility that the adhesive tape 30 cannot be accurately stuck to an outer edge 2A of each of the semiconductor chips 2 (that is, mask 24). Therefore, in the present embodiment, as shown in FIG. 4B, the space between the semiconductor chips 2 is widened.

Figure 4B:
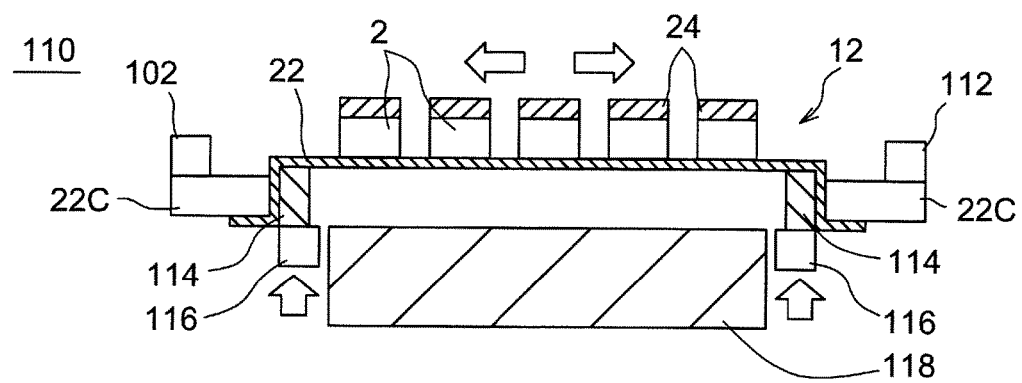
FIG. 4B is a second cross-sectional view showing the expanding process in the mask removing step.

As shown in FIG. 4B, in the present embodiment, an expanding process of pulling the dicing tape 22 outward is performed so as to widen the space between the semiconductor chips 2 before sticking the adhesive tape 30. The expanding section 110 for performing the expanding process is provided with a pressing member 112, a ring member 114, an elevator 116, and a placing table 118. The pressing member 112 is disposed along the frame 22C of the dicing tape 22 to fix the frame 22C. The ring member 114 is a ring-shaped member and is disposed concentrically with the frame 22C below the dicing tape 22, and raises and lowers the dicing tape 22 with respect to the frame 22C. The elevator 116 raises and lowers the ring member 114. In the processing at the expanding section 110, with the semiconductor wafer 12 placed on the placing table 118 and the pressing member 112 pressing the frame 22C of the dicing tape 22 to fix, the ring member 114 is raised so that the elevator 116 floats the dicing tape 22 from the placing table 118. In this case, since the dicing tape 22 is expanded, the space between the semiconductor chips 2 is widened, and for example, the space is about 50 µm.

As shown in FIG. 3, after the expanding process, the semiconductor wafer 12 is conveyed by the conveying mechanism 160 from the expanding section 110 to the adhesive tape attaching/detaching section 120 in a state where the dicing tape 22 is expanded. In the adhesive tape attaching/detaching section 120, the adhesive tape 30 is stuck to the mask 24 as shown in FIG. 5A, and the adhesive tape 30 is peeled off together with the mask 24 as shown in FIG. 5B.

Figure 5A:
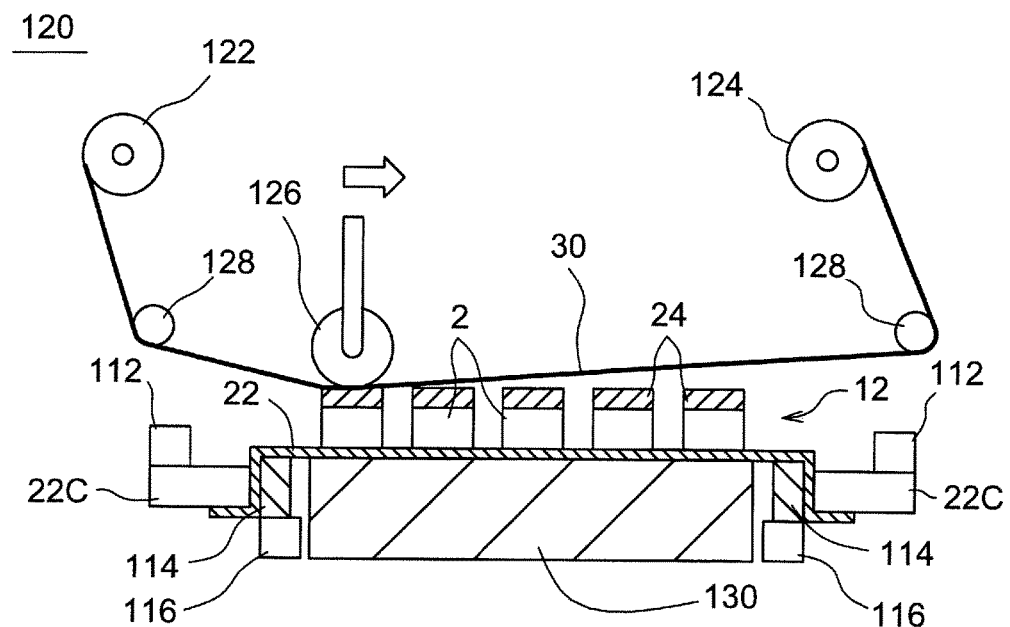
FIG. 5A is a cross-sectional view showing the sticking process of the adhesive tape in the mask removing step.

As shown in FIG. 5A, the adhesive tape attaching/detaching section 120 is provided with a supply roller 122, a collection roller 124, a pressing roller 126, two pulling tools 128, and a placing table 130. The semiconductor wafer 12 is placed on the placing table 130. An unused adhesive tape 30 is wound around the supply roller 122, and the position of the supply roller 122 is fixed. The collection roller 124 shares the adhesive tape 30 with the supply roller 122. That is, the collection roller 124 winds up the adhesive tape 30 supplied from the supply roller 122 and after used for peeling off the mask 24 to collect. The collection roller 124 is disposed at the same height as the supply roller 122 and is movable in the horizontal direction (see the arrow in FIG. 5B). The respective two pulling tools 128 are disposed below the supply roller 122 and the recovery roller 124. One of the two pulling tools 128 is fixed and the other is movable in the horizontal direction. The adhesive tape 30 is pulled by the two pulling tools 128, thereby being positioned slightly above the mask 24 formed on the semiconductor wafer 12 placed on the placing table 130. The pressing roller 126 is movable (see the arrow in FIG. 5A), presses the adhesive tape 30 toward the semiconductor chip 2 on which the mask 24 is formed with a force that does not damage the semiconductor chip 2, and sticks the adhesive tape 30 to the mask 24.

Figure 5B:
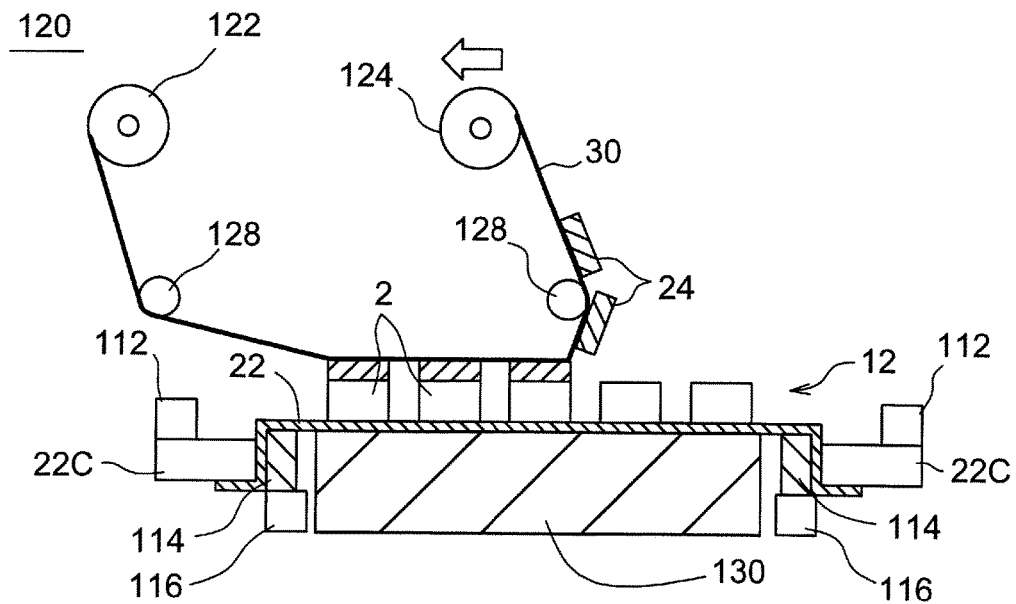
FIG. 5B is a cross-sectional view showing a peeling process of the adhesive tape in the mask removing step.

As shown in FIG. 5B, when the adhesive tape 30 is peeled off, the collection roller 124 and the other pulling tool 128 are respectively moved toward the supply roller 122 and the one pulling tool 128. In this case, the collection roller 124 winds up the adhesive tape 30 used for removing the mask 24 to collect. Thus, the adhesive tape 30 is peeled off, and the mask 24 is peeled off from each semiconductor chip 2.

As shown in FIG. 3, the semiconductor wafer 12 from which the mask 24 is peeled off is conveyed from the adhesive tape attaching/detaching section 120 to the second cassette placing section 150 by the conveying mechanism 160. Therefore, the semiconductor wafer 12 after the treatment in the mask removing step is placed on the second cassette placing section 150.

Figure 6:
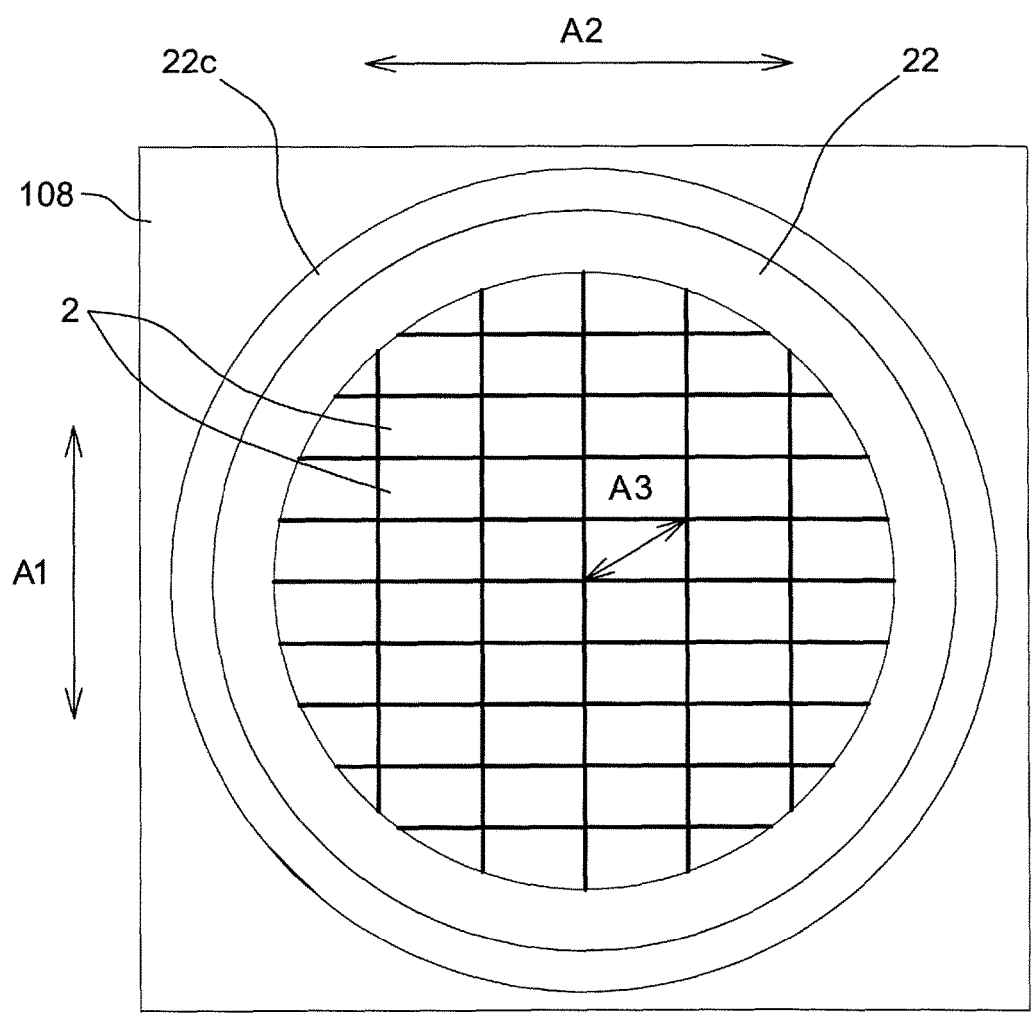
FIG. 6 is a plan view of an element chip for showing peeling direction of the mask.

As shown in FIG. 6, in the present embodiment, the direction in which the adhesive tape 30 is peeled off is defined. Specifically, the adhesive tape 30 is peeled off while being pulled in a direction deviated from the short side direction A1 and the long side direction A2 of the rectangular semiconductor chip 2. In this case, it is preferable that the direction deviated from the short side direction A1 and the long side direction A2 is the diagonal direction A3 of the element chip.

According to the present embodiment, as shown in FIG. 1J, when the mask 24 is removed from the semiconductor chip 2 including the bumps 10 on the front surface 6A, the adhesive tape 30 is used without ashing. Since the mask 24 can be physically removed by using the adhesive tape 30, the mask 24 can be easily removed as compared with in ashing. Furthermore, even if residue is present on the front surface of the mask 24, the residue is physically removed together with the mask 24. In addition, as shown in FIGS. 4A and 4B, in this method, the peeling direction of the adhesive tape 30 is defined in a direction deviated from the short side direction A1 and the long side direction A2 of the semiconductor chip 2. Since the peeling direction is thus defined, the mask 24 can be peeled off from the corner portion of the semiconductor chip 2 together with the adhesive tape 30. That is, since the mask 24 can be peeled off from a point rather than being peeled off from the side, the load on the semiconductor chip 2 at the initial stage of peeling can be reduced. Therefore, the mask 24 can be easily peeled off cleanly, the semiconductor chip 2 hardly breaks, and the semiconductor chip 2 is hardly peeled off from the dicing tape 22, so the productivity can be improved. In addition, even when the mask 24 is left unremoved, since the mask 24 on the surface 6A is substantially removed, the remaining part is substantially a slight degree of residue with a rabbit-ear shape on the pattern side surface. Therefore, for example, the remaining part can be removed by weak wet cleaning or the like.

In addition, according to the present embodiment, the direction in which the adhesive tape 30 is peeled off is defined in the diagonal direction A3 of the semiconductor chip 2. The diagonal direction A3 of the semiconductor chip 2 is a line capable of securing the longest flow line for peeling off the mask 24. Therefore, the load generated at the time of peeling off the mask 24 can be dispersed and the local load on the semiconductor chip 2 can be reduced. Therefore, the semiconductor chip 2 hardly breaks, and the semiconductor chip 2 is hardly peeled off from the dicing tape 22.

In addition, according to the present embodiment, as shown in FIG. 1G, since the contact area between the mask 24 and the semiconductor wafer 12 can be reduced by the gap S being provided, the mask 24 is easily peeled off from the semiconductor wafer 12.

In addition, according to the present embodiment, as shown in FIG. 2, since the dicing tape 22 (that is, semiconductor wafer 12) is attracted to the stage 60 by electrostatic attraction when the mask 24 is peeled off, the dicing tape 22 can be prevented from leaving the stage 60, and the mask can be stably peeled off from the substrate. This effect is the same also in the case of vacuum attraction.

In addition, according to the present embodiment, as shown in FIG. 1J, since the adhesive layer 30A of the adhesive tape 30 has UV curability, the adhesive force between the adhesive tape 30 and the mask 24 can be enhanced by UV irradiation. Thus, the mask 24 can be prevented from remaining when the adhesive tape 30 is peeled off, that is, the mask 24 can be easily peeled off from the semiconductor wafer 12 together with the adhesive tape 30. This effect is the same even if heat treatment is performed when the adhesive layer 30A of the adhesive tape 30 has thermosetting property.

Second Embodiment

The method of manufacturing the semiconductor chip 2 of the present embodiment is the same as that of the first embodiment except the mask removing step. Therefore, description of parts similar to those of the first embodiment will be omitted. First, as in the first embodiment, the first preparation step (FIG. 1A), the second preparation step (FIG. 1B), the protection step (FIG. 1C), the thinning step (FIG. 1D), the first holding step (FIG. 1E), the second holding step (FIG. 1F), the first mask forming step (FIG. 1G), the second mask forming step (FIG. 1H), and the dicing step (FIG. 1I) are sequentially performed.

Figure 7:
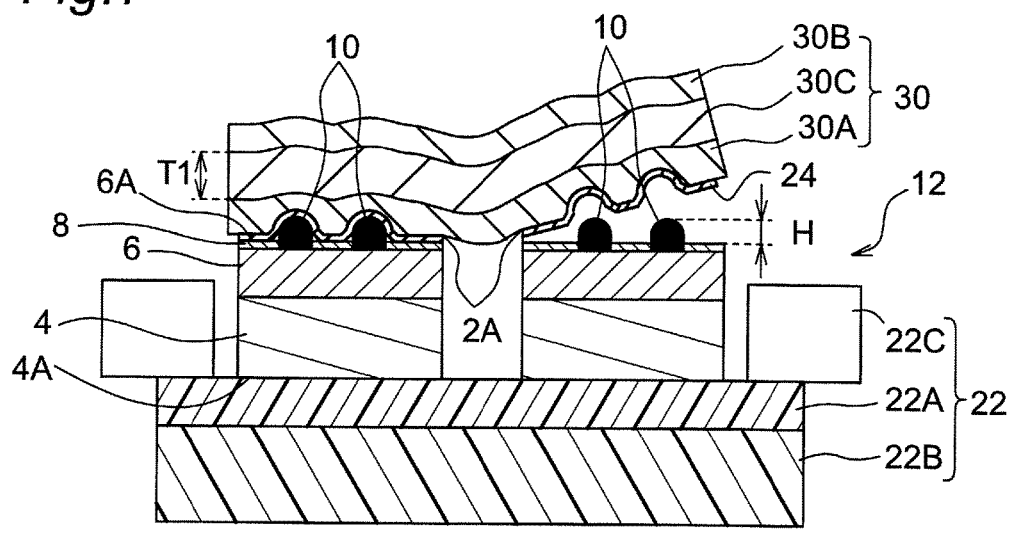
FIG. 7 is a cross-sectional view showing a mask removing step of the method of manufacturing the element chip according to a second embodiment of the present invention.

In the mask removing step shown in FIG. 7, the adhesive tape 30 is stuck to the front surface 6A of the semiconductor chip 2, and the adhesive tape 30 is peeled off together with the mask 24, whereby the mask 24 is removed. In the second embodiment, the adhesive tape 30 used for peeling off the mask 24 has a three-layer structure. That is, the adhesive tape 30 includes an adhesive layer 30A, a resin base layer 30B, and a buffer layer 30C therebetween. The adhesive layer 30A of the present embodiment is made of a UV curable resin. In addition, the buffer layer 30C is made of a thermoplastic resin. In this step, UV light irradiation is performed after the adhesive tape 30 is stuck and before the adhesive tape 30 is peeled off. Thus, curing the adhesive layer 30A to enhance the adhesive force between the adhesive layer 30A and the mask 24 and softening the buffer layer 30C with radiant heat from the UV lamp for UV light irradiation to improve the deformability increases the degree of adhesion between the adhesive tape 30 and the mask 24. Alternatively, the adhesive layer 30A may be made of a thermosetting resin, and the buffer layer 30C may be made of a thermoplastic resin. In this case, heat treatment after the adhesive tape 30 is stuck and before the adhesive tape 30 is peeled off cures the adhesive layer 30A and softens the buffer layer 30C, which allows the same effect to be obtained. The heat treatment temperature at this time is preferably a temperature at which the adhesive layer 30A is cured and the buffer layer 30C is softened. In addition, the thickness T1 of the buffer layer 30C is larger than the height H of the bumps 10, and the adhesive tape 30 can cover the bumps 10 with this thickness.

Thus, the semiconductor chip 2 is manufactured as shown in FIG. 1K through the steps in FIGS. 1A to 1I and FIG. 7.

Here, with reference to FIGS. 3 to 5B, the mask removing step will be described in detail. It should be noted that these figures are schematically shown for clarity of description. Therefore, there may be a portion not corresponding to FIG. 7 showing the above-described mask removing step.

As in the first embodiment, the mask removing step of the present embodiment can be achieved by using the mask removing apparatus 100 shown in FIG. 3, performing the expanding process as shown in FIGS. 4A to 4B, and then sticking and peeling the adhesive tape 30 as shown in FIGS. 5A to 5B. It should be noted that the sticking of the adhesive tape 30 is not limited to the sticking by the pressing roller 126 as shown in FIG. 5A. In place of or in addition to the pressing roller 126, the sticking of the adhesive tape 30 may be performed by pressing the adhesive tape 30 toward the semiconductor wafer 12 with compressed fluid such as compressed air while the adhesive tape 30 is brought into contact with the front surface 6A of the semiconductor wafer 12. In this case, the adhesive tape 30 can be stuck along the unevenness of the bumps 10 and the like on the front surface 6A without excessive force being applied to the semiconductor chip 2.

According to the present embodiment, as shown in FIG. 7, when the mask 24 is removed from the semiconductor chip 2 having the bumps 10 on the front surface 6A, the adhesive tape 30 is used without ashing. Since the mask 24 can be physically removed by using the adhesive tape 30, the mask can be easily removed as compared with in ashing. Furthermore, even if residue is present on the front surface of the mask 24, the residue is physically removed together with the mask 24. In addition, in this method, since the adhesive tape 30 is stuck so as to be in contact with the outer edge 2A of the semiconductor chip 2, the mask 24 can be peeled off from the end portion of the semiconductor chip 2 when the adhesive tape 30 is peeled off, that is, the mask 24 can be easily peeled off cleanly. Therefore, ashing defects can be prevented and the productivity of the semiconductor chip 2 can be improved in the method of manufacturing the semiconductor chip 2. In addition, even when the mask 24 is left unremoved, since the mask 24 on the surface 6A is substantially removed, the remaining part is substantially a slight degree of residue with a rabbit-ear shape on the pattern side surface. Therefore, for example, the remaining part can be removed by weak wet cleaning or the like.

In addition, according to the present embodiment, as shown in FIG. 4B, since the space between the semiconductor chips 2 is widened before the adhesive tape 30 is stuck by the expanding process, it becomes easy to stick the adhesive tape to the outer edge 2A (see FIG. 7) of each of the semiconductor chips 2.

In addition, according to the present embodiment, as shown in FIG. 7, providing the base layer 30B on the adhesive tape 30 allows the handleability of the adhesive tape 30 to be improved, and providing the adhesive layer 30A allows the adhesive tape 30 to be brought into close contact with the mask 24.

In addition, according to the present embodiment, as shown in FIG. 7, providing the buffer layer 30C on the adhesive tape 30 allows the elasticity of the adhesive tape 30 to be improved. Therefore, the adhesive tape 30 can be deformed into a shape matching the bumps 10 to be stuck. That is, since the contact area between the mask 24 and the adhesive tape 30 can be increased, the mask 24 can be easily peeled off from the semiconductor wafer 12 together with the adhesive tape 30. In addition, the buffer layer 30C can alleviate the impact when the adhesive tape 30 is stuck.

In addition, according to the present embodiment, since curing the adhesive layer 30A of the adhesive tape 30 by UV treatment allows the adhesive force between the adhesive tape 30 and the mask 24 to be enhanced, the mask 24 can be prevented from remaining when he adhesive tape 30 is peeled off, that is, the mask 24 can be easily peeled from the semiconductor wafer 12 together with the adhesive tape 30. This effect is the same also in the case of the above-described heat treatment.

In addition, according to the present embodiment, the buffer layer 30C of the adhesive tape 30 is softened by heat treatment, and the degree of adhesion between the adhesive tape 30 and the mask 24 can be increased. That is, since the contact area between the mask 24 and the adhesive tape 30 can be further increased, the mask 24 can be easily peeled off from the semiconductor wafer 12 together with the adhesive tape 30.

In addition, according to the present embodiment, as shown in FIG. 7, since the thickness T1 of the buffer layer 30C is made larger than the height of the bumps 10, the bumps 10 can be covered with the buffer layer 30C and the adhesive layer 30A. Therefore, the contact area between the mask 24 and the adhesive tape 30 is increased, and the mask 30 is easily peeled off cleanly.

In addition, according to the present embodiment, as shown in FIG. 1G, since providing the gap S allows the contact area between the mask 24 and the semiconductor wafer 12 to be reduced, the mask 24 is easily peeled off from the semiconductor wafer 12.

In addition, according to the present embodiment, as shown in FIG. 2, since the dicing tape 22 is attracted to the stage 60 by electrostatic attraction, the dicing tape 22 can be prevented from separating from the stage 60 when the mask 24 is peeled off, so that the mask 24 can be stably peeled off from the semiconductor wafer 12. This effect is the same also in the case of the above-described vacuum attraction.

Third Embodiment

Figure 8:
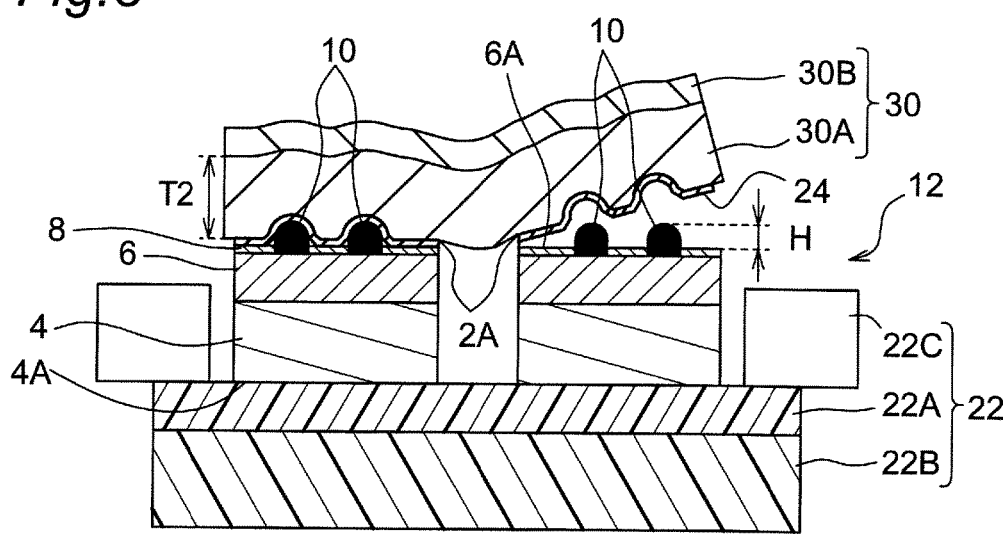
FIG. 8 is a cross-sectional view showing a mask removing step of the method of manufacturing the element chip according to a third embodiment of the present invention.

The method of manufacturing the semiconductor chip 2 of the present embodiment shown in FIG. 8 is the same as that of the second embodiment except for the adhesive tape 30 used in the mask removing step. Therefore, description of parts similar to those of the second embodiment will be omitted.

As shown in FIG. 8, in the mask removing step of the method of manufacturing the semiconductor chip 2 of the present embodiment, the adhesive tape 30 has a two-layer structure. That is, the adhesive tape 30 includes the adhesive layer 30A and the resin base layer 30B, and does not include the buffer layer 30C (see FIG. 7). As in the second embodiment, the adhesive layer 30A may be made of a UV curable resin, more specifically, a thermosetting resin. In addition, the thickness T2 of the adhesive layer 30A is larger than the height H of the bumps 10, so that the adhesive tape 30 can cover the bumps 10.

According to the present embodiment, as shown in FIG. 8, since the thickness T2 of the adhesive layer 30A is made larger than the height H of the bumps 10, the bumps 10 can be covered with the adhesive layer 30A. Therefore, the contact area between the mask 24 and the adhesive tape 30 is increased, and the mask 24 is easily peeled off cleanly.

As described above, although the specific embodiments of the present invention and its modifications are described, the present invention is not limited to the above-described embodiments, and various modifications can be made within the scope of the present invention. For example, an appropriate combination of contents of the individual embodiments may be one embodiment of the present invention.

What is claimed is:

1. A method of manufacturing an element chip comprising:
    preparing a substrate having a first surface with a step, a second surface opposite to the first surface, a plurality of element regions in each of which the step is formed, and a dividing region that defines each of the element regions;
    forming a mask on the first surface of the substrate so as to cover each of the element regions and to expose the dividing region;
    exposing the first surface of the substrate to plasma in a state where the second surface of the substrate is held by a holding member to dice the substrate into a plurality of rectangular element chips by etching the dividing region exposed from the mask up to the second surface while protecting each of the element regions by the mask from plasma; and
    removing the mask remaining on the surface of the substrate from the surface of the diced substrate together with an adhesive tape by peeling off the adhesive tape while being pulled in a direction deviated from a short side direction and a long side direction of the element chip after sticking the adhesive tape to the side of the first surface of the diced substrate.

2. The method of manufacturing the element chip according to claim 1,
    wherein the adhesive tape is peeled off while being pulled in a diagonal direction of the element chip.

3. The method of manufacturing the element chip according to claim 1,
    wherein the mask is formed by sticking a sheet-like mask and a gap is provided between the periphery of the step and the sheet-like mask.

4. The method of manufacturing the element chip according to claim 1,
    wherein the mask is removed in a state where the holding member is placed on a stage with being vacuum-attracted to the stage.

5. The method of manufacturing the element chip according to claim 1,
    wherein the mask is removed in a state where the holding member is placed on a stage with being electrostatically attracted to the stage.

6. The method of manufacturing the element chip according to claim 1,
    wherein an adhesive force between the adhesive tape and the mask is enhanced by heating the adhesive tape after sticking the adhesive tape and before peeling off the adhesive tape.

7. The method of manufacturing the element chip to claim 1,
    wherein an adhesive force between the adhesive tape and the mask is enhanced by irradiating the adhesive tape with UV light after sticking the adhesive tape and before peeling off the adhesive tape.

* * * * *